(12) United States Patent
Rostamianfar et al.

(10) Patent No.: US 8,890,846 B2
(45) Date of Patent: Nov. 18, 2014

(54) SYSTEM AND METHOD FOR TOUCHLESS SWITCH INTERFACE

(75) Inventors: Omid Rostamianfar, Thornhill (CA); Asha Rostamianfar, Thornhill (CA)

(73) Assignees: Omid Rostamianfar, Thornhill (CA); Asha Rostamianfar, Thornhill (CA)

( * ) Notice: Subject to any disclaimer, the term of this patent is extended or adjusted under 35 U.S.C. 154(b) by 0 days.

(21) Appl. No.: 13/558,528

(22) Filed: Jul. 26, 2012

(65) Prior Publication Data

US 2014/0028378 A1 Jan. 30, 2014

(51) Int. Cl.
*G06F 3/042* (2006.01)

(52) U.S. Cl.
USPC .......................................................... 345/175

(58) Field of Classification Search
USPC ................................................. 345/173–178
See application file for complete search history.

(56) References Cited

U.S. PATENT DOCUMENTS

| 5,369,416 | A | * | 11/1994 | Haverty et al. | ................. | 345/39 |
| 2011/0080252 | A1 | * | 4/2011 | Ibsies | ............................ | 340/3.1 |
| 2011/0080277 | A1 | * | 4/2011 | Traylor et al. | ................ | 340/435 |
| 2012/0026836 | A1 | * | 2/2012 | Scripca et al. | .................. | 367/99 |

* cited by examiner

*Primary Examiner* — Alexander Eisen
*Assistant Examiner* — Robin Mishler
(74) *Attorney, Agent, or Firm* — Grant Tisdall; Gowling Lafleur Henderson LLP

(57) ABSTRACT

A method and system for guiding a trigger agent to activate a touchless switch having a proximity sensor and a plurality of activatable indicator lights. The method comprises detecting the trigger agent within a proximity threshold, activating at least one of the indicator lights according to a first indicator format, detecting a continuing presence of the trigger agent to progressively activate additional indicator lights as the trigger agent continues within the proximity threshold, detecting a retracting movement of the trigger agent away from the proximity sensor to progressively de-activate the activated indicator lights as the trigger agent retracts, and in response to detecting that the trigger agent has reached an activation time threshold, activating the touchless switch while activating the indicator lights according to a second indicator format.

20 Claims, 3 Drawing Sheets

SYSTEM AND METHOD FOR TOUCHLESS SWITCH INTERFACE

FIELD

The present invention relates generally to a system and method for providing user feedback in a touchless switch interface.

BACKGROUND

Mechanical pushbutton switches pose some inherent problems, the most readily evident related to the fact that mechanical moving parts are inherently subject to limited reliability in operation. But there also arises valid health concerns due to repeated and frequent touching by innumerable members of the public, and potentially adverse consequences from virus or germ transmission in this manner.

To alleviate health concerns associated with public touching, replacement solutions which eliminate or minimize the need for mechanical buttons may be desirable. Success in the adoption of any alternatives by users, however, depend on inherent usability by way of intuitiveness of any proposed replacement solutions. Stated another way, it will be important to give the user continuous feedback to guide attempted activation of the replacement solutions using a finger or hand, making usage of such solution very intuitive to the user, therefore increasing the likelihood of successful and widespread adoption.

SUMMARY OF THE INVENTION

Provided is a method for guiding a trigger agent to activate a touchless switch having a proximity sensor and a plurality of activatable indicator lights. The method comprises detecting the trigger agent within a proximity threshold of the proximity sensor; in response to the detecting, activating at least one of the plurality of indicator lights according to a first indicator format; while within the proximity threshold: in response to detecting a continuing presence of the trigger agent, progressively activating additional ones of the plurality of indicator lights as the presence of the trigger agent continues; in response to detecting a retracting movement of the trigger agent away from the proximity sensor, progressively de-activating the activated ones of the plurality of indicator lights as the trigger agent progresses away from the proximity sensor; activating the touchless switch in response to detecting that the continuing presence of the trigger agent has reached an activation time threshold; and activating the plurality of indicator lights according to a second indicator format to indicate activation of the touchless switch.

In one embodiment, the activatable indicator lights comprise light emitting diodes (LEDs).

In another embodiment, the first indicator format comprises a first color and the second indicator format comprises a second color. The first color may be yellow and the second color may be green.

In yet another embodiment, the first indicator format comprises a first [geometrical, size] arrangement of indicator lights and the second indicator format comprises a second arrangement of indicator lights.

Yet further, the method may further comprise activating an audible signal from an audio component electrically coupled to the touchless switch in response to detecting that the continuing presence of the trigger agent has reached the activation time threshold.

The proximity threshold is defined by a region in three dimensional (3D) space around the touchless switch, in an embodiment.

Also provided is a plurality of touchless switches arranged to form an elevator control panel system. Each of the plurality of switches comprises a proximity sensor coupled to a processor and a plurality of activatable indicator lights coupled to the processor, the proximity sensor detecting the trigger agent within a proximity threshold thereof, thereby causing activation of at least one of the plurality of indicator lights according to a first indicator format, and while within the proximity threshold, in response to detection of a continuing presence of the trigger agent, progressively activating additional ones of the plurality of indicator lights as the presence of the trigger agent continues, and upon a retracting movement of the trigger agent away from the proximity sensor being detected, progressively de-activating the activated ones of the plurality of indicator lights as the trigger agent progresses away from the proximity sensor, whereupon in response to detecting that the continuing presence of the trigger agent has reached an activation time threshold, activating the touchless switch while activating the plurality of indicator lights according to a second indicator format.

In one embodiment of the system, at least a subset of the ones of the plurality of touchless switches are embodied by the indicator lights arranged around at least one integer number representing a destination floor serviced by the elevator.

In another embodiment, the system further comprises an audio component configured to emit an audible signal in response to detecting that the continuing movement of the trigger agent has reached the activation time threshold of the touchless switch.

In yet another embodiment, the activatable indicator lights comprise light emitting diodes (LEDs), and the first indicator format comprises a first color and the second indicator format comprises a second color.

Further provided is a touchless switch interface system comprising a processor; at least one proximity sensor coupled to the processor; a plurality of indicator lights coupled to the processor; and a memory coupled to the processor, the memory storing instructions which, when executed in the processor, cause the processor to detect a trigger agent within a proximity threshold of the proximity sensor; in response to the detecting, activate at least one of the plurality of indicator lights according to a first indicator format; while within the proximity threshold: in response to detecting a continuing presence of the trigger agent, progressively activate additional ones of the plurality of indicator lights as the presence of the trigger agent continues; in response to detecting a retracting movement of the trigger agent away from the at least one proximity sensor, progressively de-activate the activated ones of the plurality of indicator lights as the trigger agent moves away; activate the touchless switch in response to detecting that the continuing presence of the trigger agent has reached an activation time threshold; and activate the plurality of indicator lights according to a second indicator format to indicate activation of the touchless switch.

In one embodiment, the system further comprises an audio component electrically coupled to the touchless switch for activating an audible signal in response to detecting that the continuing presence of the trigger agent has reached the activation time threshold.

BRIEF DESCRIPTION OF THE DRAWINGS

Embodiments will now be described by way of example only, with reference to the following drawings in which.

DETAILED DESCRIPTION

Figure 1:
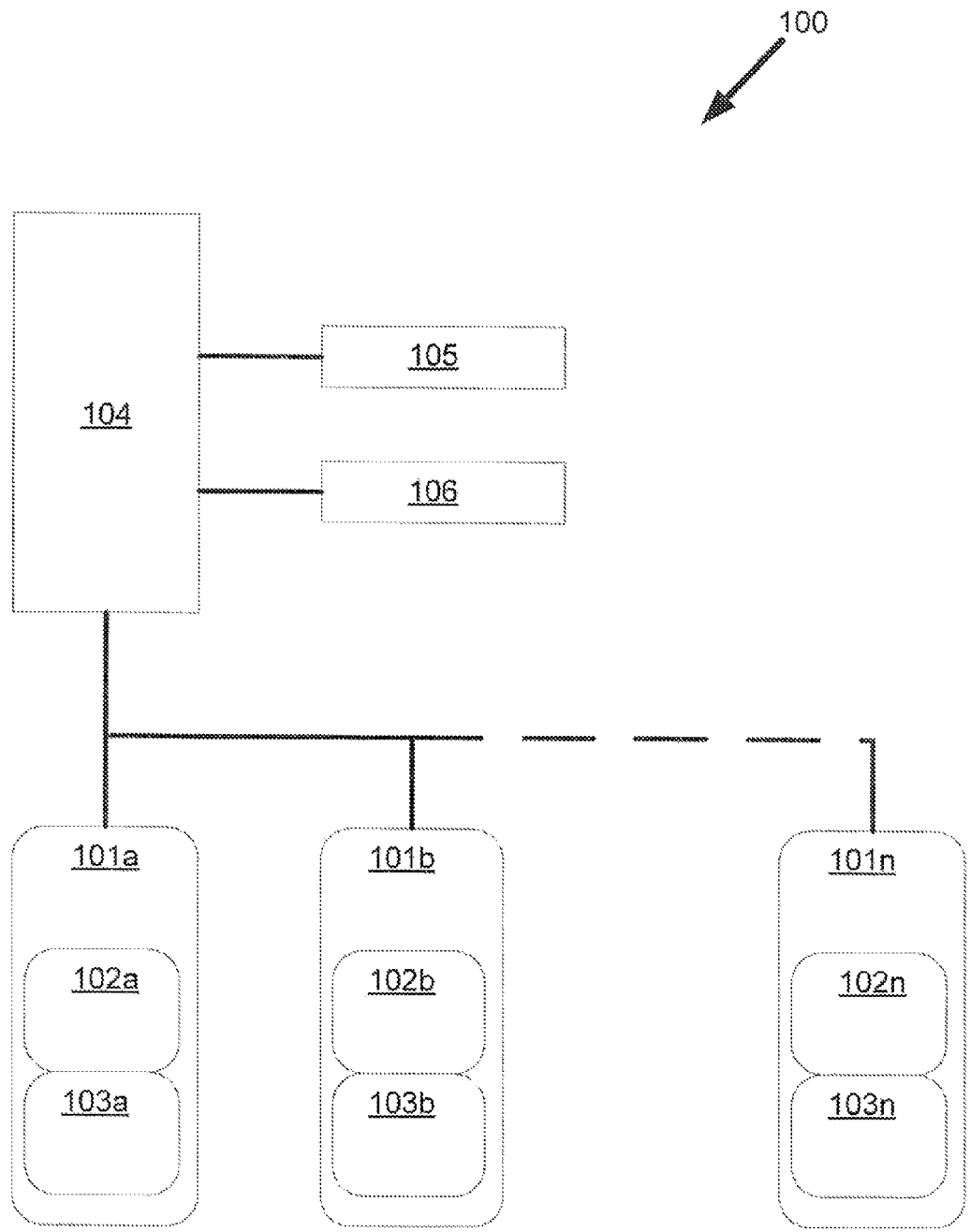
FIG. 1 illustrates, in an embodiment, a schematic arrangement for a touchless switch interface.

Referring now more particularly to the accompanying figures, FIG. 1 illustrates an embodiment of touchless switch interface system 100. Processor 104 performs central control of touchless switch interface system 100. Proximity sensor 102a is coupled to processor 104 and may employ existing proximity sensors used for proximity sensing, such as reflective infrared, capacitive, reflective optical or laser sensors, passive infrared and ultrasound or radar.

A set of indicator lights 103a, providing visual feedback to a user when activated electrically to indicate status of touchless switch interface system 100, are coupled to processor 104. The activatable indicator lights 103a may comprise light emitting diodes (LEDs), including varied LEDs emitting particular different colors when electrically activated. Proximity sensor 102a taken in conjunction with indicator lights 103a may be considered a "virtual button", as represented via touchless switch 101a which generally replaces a mechanical push button of the prior art. It will be apparent that touchless switch interface system 100 is intended to replace the need for users having to push and mechanically depress actual button switches.

It is contemplated that a control panel, including but not limited to an elevator control panel, may comprise implementation of any additional numbers of virtual button interfaces, represented schematically in FIG. 1 by touchless switches 101a 101b through 101n, where n represents any positive integer, including respective proximity sensors 102b through 102n and indicator light sets 103b through 103n.

Still in regard to FIG. 1, memory 105, which may be such as a random access or flash memory, is electrically coupled to processor 104, storing computer instructions for execution in processor 104. Audio signal component 106, selected to emit an audible chime, for example, is electrically coupled to processor 104, and may be employed, either separately or in conjunction with indicator lights 103a to provide an audible indication of a status of touchless switch interface system 100.

Figure 2:
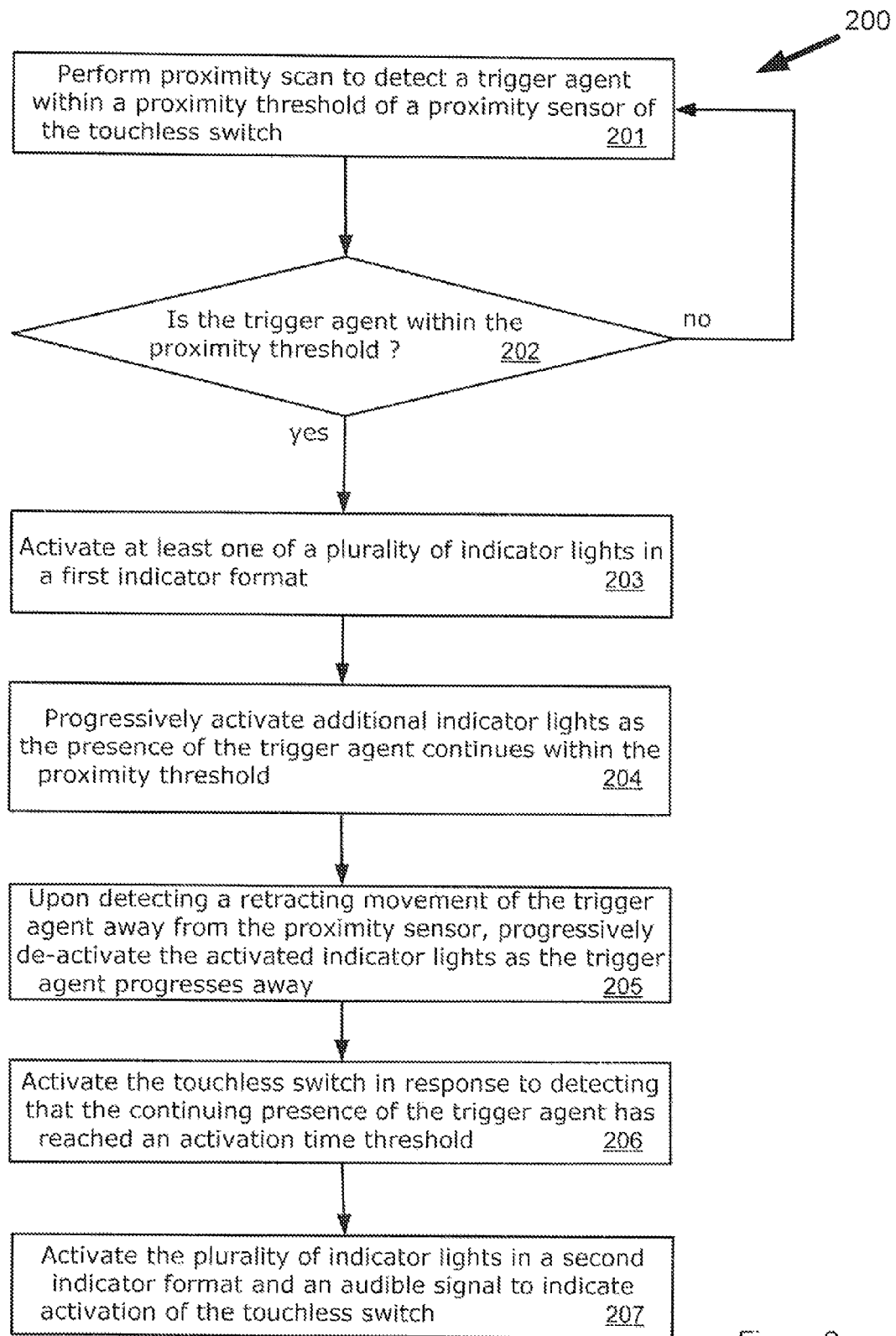
FIG. 2 is a flowchart illustrating, in one embodiment, a process for activating and using the touchless switch interface.

FIG. 2 is a flowchart illustrating, in one embodiment, a process 200 for activating and using the touchless switch interface system 100, with particular regard to touchless switch 101a. At step 201, proximity sensor 102a performs a scan to determine whether a trigger agent, such as a human user's finger or hand, is within a predetermined proximity threshold of proximity sensor 102a. The proximity threshold may be defined by an enveloping region in three dimensional (3D) space around proximity sensor 102a, for example, a 3D envelope described by a hemisphere having a certain radius around proximity sensor 102a. Thus in an unactivated state of touchless switch 101a, the trigger agent will be outside of the proximity threshold. As the trigger agent moves towards touchless switch 101a, at some point crossing the proximity threshold, touchless switch 101a then changes to either a pending activation state or an activated state, as will be described further below.

At step 202, it is detected whether the trigger agent is within the proximity threshold.

At step 203, at least one of a plurality of indicator lights 103a is activated, in a first indicator format. The first indicator format may comprise a particular color, such as green, yellow, red or blue, or even a particular geometrical arrangement of activated ones of indicator lights 103a.

At step 204, additional indicator lights of indicator light set 103a are serially and progressively activated as the presence of the trigger agent continues within the proximity threshold of proximity sensor 102a.

It is contemplated that a user might attempt activation of touchless switch 101a, but conceivably change his or her mind, for a variety of reasons such as resulting from a simple error in selection of touchless switch 101a. Then, in an attempt at rectification, proceed to retract his or her hand, the trigger agent, away from touchless switch 101a and proximity sensor 102a. At step 205, since touchless switch 101a has not yet been activated, at any point during this pre-activation or pending activation state, upon detecting a retracting movement of the trigger agent away from proximity sensor 102a, the activated ones of indicator light set 103a may be serially de-activated from their lighted state as the user's hand or finger progressively retracts.

At step 206, notwithstanding an attempted retraction of the trigger agent, touchless switch 101a is activated in response to detecting that the continuing presence of the trigger agent within the proximity envelope or threshold around proximity sensor 102a has reached or exceeded a predefined threshold activation time limit.

At step 207, the user may be provided with visual and audible confirmation that touchless switch 101a is now in an activated state. More specifically, in one embodiment, all the lights of indicator light set 103a are electrically activated in a second indicator format, and an audible signal provided to indicate activation of touchless switch 101a. The second indicator format may involve a different light color of the indicator light set 103a, to provide a user with visual feedback unique to the touchless switch 101a in an activated state, easily distinguishable from the above described the first indicator format used for the pending activation state. Also contemplated is activating the plurality of indicator lights 103a according to a second indicator format to indicate activation of touchless switch 101a, which may comprise activating lights in a different geometrical arrangement or size within indicator light set 103a.

Figure 3A:
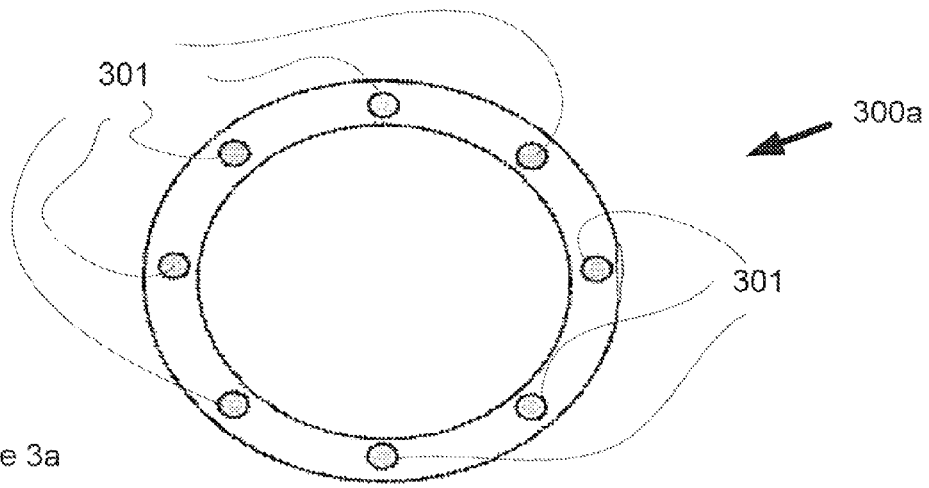
FIGS. 3a-3c illustrate, in an embodiment, a visual feedback system provided to a user of the touchless switch interface.
Figure 3B:
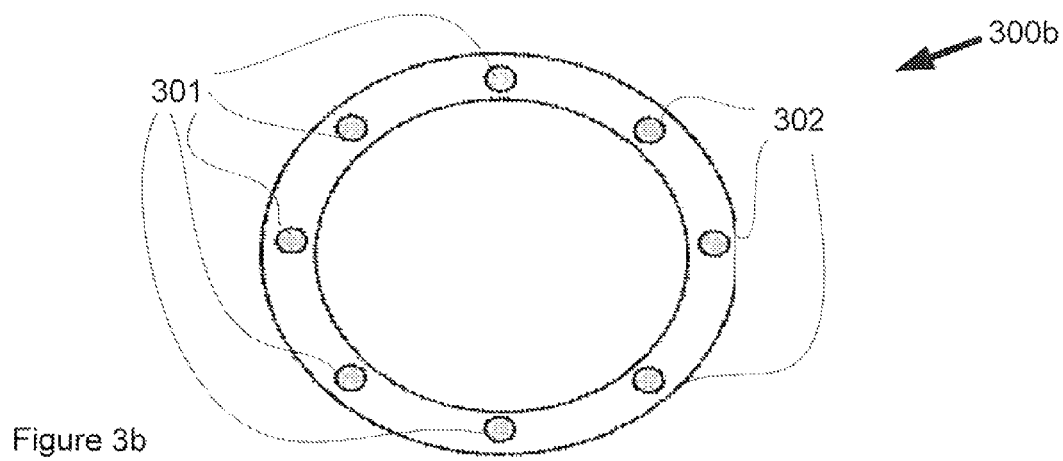
Figure 3C:
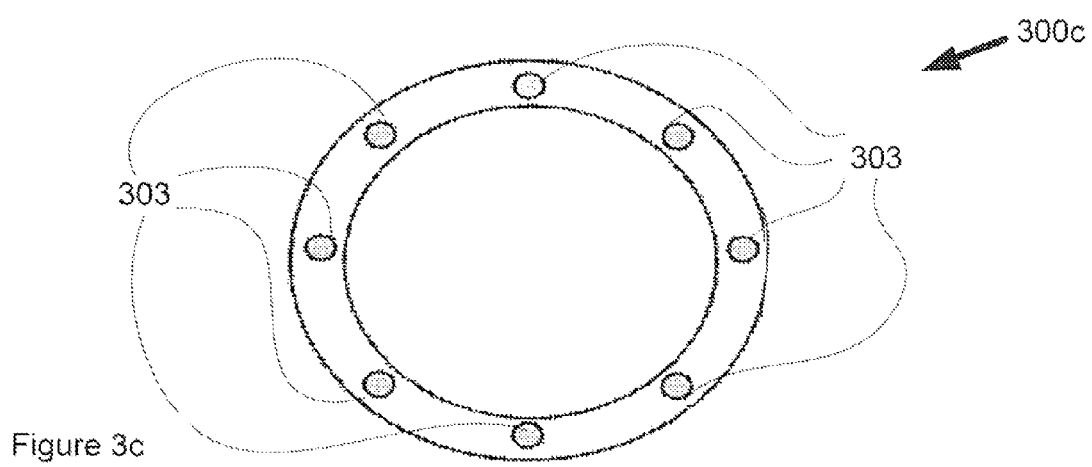

FIGS. 3a-3c illustrate, in an embodiment, a visual feedback system provided to a user of touchless switch 101a.

In FIG. 3a, prior to any trigger agent being applied to proximity sensor 102a of touchless switch 101a, all individual lights 301 of indicator light set 103a are unactivated or unlit to indicate an unactivated state 300a of touchless switch 101a. While individual lights 301 of indicator light set 103a are depicted in a generally circular arrangement, it is contemplated that other alternate arrangements, including rectangular, triangular or other combinations of arrangements may be employed.

FIG. 3b depicts a pending activation state 300b of touchless switch 101a. Only the ones 302 of indicator light set 103a are serially and progressively lit as the presence of a trigger agent is detected, and continues, within the proximity threshold of proximity sensor 102a. The lighted ones 302 may be lit in a first color, such as yellow, during this pending activation state 300b of touchless switch 101a FIG. 3c depicts a fully activated state 300c of touchless switch 101a, where the presence of the trigger agent within the proximity threshold of proximity sensor 102a has continued for an amount of time reaching or exceeding a predetermined threshold activation time limit, resulting in all lighted ones 303 within indicator light set 103a. To indicate this activated state 300c of touchless switch 101a in a manner easily and visibly distinguishable from pending activation state 300b, the lighted ones 303 may be lit in a second color, such as green, different from the first color.

In one application of touchless switch interface system 100, a plurality of touchless switches 101a through 101n may arranged to form a touchless elevator control panel system, with the touchless switches being embodied by the indicator lights arranged around integer numbers representing destination floors serviced by the elevator, or other elevator control panel functions in replacement of mechanical pushbutton switches.

Varying modifications of the touchless switch interface system and method, and varying practical applications in addition to the elevator control panel as described herein, are contemplated and will be apparent to those skilled in the art without departing from the scope of the invention as defined by the appended claims.

We claim:

1. A method for guiding a trigger agent to activate a touchless switch having a proximity sensor and a plurality of activatable indicator lights, the touchless switch having an unactivated state and an activated state, the method comprising:
   detecting that the trigger agent is within a proximity threshold of the proximity sensor while the touchless switch remains in the unactivated state;
   in response to the detecting, activating at least one of the plurality of indicator lights while the touchless switch remains in the unactivated state;
   progressively activating additional ones of the plurality of indicator lights as the presence of the trigger agent continues within said proximity threshold of the proximity sensor while the touchless switch remains in the unactivated state;
   in response to detecting a retracting movement of the trigger agent away from the proximity sensor, progressively de-activating the activated ones of the indicator lights as the trigger agent progresses away from the proximity sensor while the touchless switch remains in the unactivated state; and
   placing the touchless switch in the activated state in response to detecting that the continuing presence of the trigger agent has reached an activation time threshold.

2. The method of claim 1 wherein the activatable indicator lights comprise light emitting diodes (LEDs).

3. The method of claim 2 wherein a first indicator format of the plurality of activatable indicator lights comprises a first color and a second indicator format of the plurality of activatable indicator lights comprises a second color.

4. The method of claim 3 wherein the first color is yellow and the second color is green.

5. The method of claim 2 wherein a first indicator format of the plurality of activatable indicator lights comprises a first arrangement of indicator lights and a second indicator format of the plurality of activatable indicator lights comprises a second arrangement of indicator lights.

6. The method of claim 1 further comprising activating an audible signal from an audio component electrically coupled to the touchless switch in response to detecting that the continuing presence of the trigger agent has reached the activation time threshold.

7. The method of claim 6 wherein the audible signal comprises an audible chime.

8. The method of claim 1 wherein said proximity threshold is defined by a region in three dimensional (3D) space around the touchless switch.

9. The method of claim 1 wherein the touchless switch is embodied by the plurality of indicator lights in a generally circular arrangement.

10. The method of claim 1 wherein the touchless switch is embodied by the plurality of indicator lights in a generally rectangular arrangement.

11. The method of claim 1 wherein the trigger agent comprises at least one of a user's hand and finger.

12. A system of a plurality of touchless switches arranged to form an elevator control panel, a touchless switch of the plurality of touchless switches having an unactivated state and an activated state, the touchless switch comprising:
   a proximity sensor coupled to a processor; and
   a plurality of activatable indicator lights coupled to the processor;
   wherein the proximity sensor detects a trigger agent within a proximity threshold thereof while the touchless switch remains in the unactivated state, thereby causing activation of at least one of the plurality of indicator lights while the touchless switch remains in the unactivated state, progressively activating additional ones of the plurality of indicator lights as the presence of the trigger agent continues within said proximity threshold while the touchless switch remains in the unactivated state, upon a retracting movement of the trigger agent away from the proximity sensor being detected, progressively de-activating the activated ones of the indicator lights as the trigger agent progresses away from the proximity sensor while the touchless switch remains in the unactivated state, and in response to detecting that the continuing presence of the trigger agent has reached an activation time threshold, placing the touchless switch in an activated state.

13. The system of claim 12 wherein the trigger agent is provided by at least one of a user's hand and finger.

14. The system of claim 12 wherein at least a subset of the ones of the plurality of touchless switches are embodied by the indicator lights arranged around at least one integer number representing a destination floor serviced by the elevator.

15. The system of claim 12 further comprising an audio component configured to emit an audible signal in response to detecting that the continuing movement of the trigger agent has reached the activation time threshold.

16. The system of claim 12 wherein the activatable indicator lights comprise light emitting diodes (LEDs).

17. The system of claim 16 wherein a first indicator format of the plurality of activatable indicator lights comprises a first color and a second indicator format of the plurality of activatable indicator lights comprises a second color.

18. The system of claim 16 wherein a first indicator format of the plurality of activatable indicator lights comprises a first arrangement of indicator lights and a second indicator format of the plurality of activatable indicator lights comprises a second arrangement of indicator lights.

19. A touchless switch interface system comprising:
   a touchless switch having an unactivated state and activated state a processor;
   at least one proximity sensor coupled to the processor;
   a plurality of indicator lights coupled to the processor; and
   a memory coupled to the processor, the memory storing instructions which, when executed in the processor, cause the processor to:
      detect that a trigger agent is within a proximity threshold of the at least one proximity sensor while the touchless switch remains in the unactivated state;
      in response to the detecting, activate at least one of the plurality of indicator lights while the touchless switch remains in the unactivated state;

progressively activate additional ones of the plurality of indicator lights as the presence of the trigger agent continues within said proximity threshold while the touchless switch remains in the unactivated state;

in response to detecting a retracting movement of the trigger agent away from the proximity sensor, progressively de-activate the activated ones of the indicator lights as the trigger agent retracts from the proximity sensor while the touchless switch remains in the unactivated state; and place the touchless switch in the activated state in response to detecting that the continuing presence of the trigger agent has reached an activation time threshold.

20. The system of claim 19 further comprising an audio component electrically coupled to the touchless switch for activating an audible signal in response to detecting that the continuing presence of the trigger agent has reached the activation time threshold.

\* \* \* \* \*